US007013806B2

(12) United States Patent
Fromson et al.

(10) Patent No.: US 7,013,806 B2
(45) Date of Patent: Mar. 21, 2006

(54) METHOD AND APPARATUS FOR APPLYING A FILM OF DEVELOPER FLUID ONTO A LITHOGRAPHIC PRINTING PLATE IN A DEVELOPING STATION

(75) Inventors: Howard A Fromson, Stonington, CT (US); William J. Rozell, Vernon, CT (US)

(73) Assignee: Anocoil Corporation, Rockville, CT (US)

( * ) Notice: Subject to any disclaimer, the term of this patent is extended or adjusted under 35 U.S.C. 154(b) by 0 days.

(21) Appl. No.: 10/783,759

(22) Filed: Feb. 20, 2004

(65) Prior Publication Data

US 2004/0237821 A1  Dec. 2, 2004

Related U.S. Application Data

(63) Continuation-in-part of application No. 10/446,582, filed on May 28, 2003, now Pat. No. 6,720,131.

(51) Int. Cl.
*B41N 3/08* (2006.01)
*B41N 3/00* (2006.01)

(52) U.S. Cl. ........................ 101/465; 101/483; 430/302
(58) Field of Classification Search ................ 101/465, 101/483; 430/300, 302, 322, 326, 273.1; 347/49; 396/567, 568, 602, 611
See application file for complete search history.

(56) References Cited

U.S. PATENT DOCUMENTS

| 5,027,146 | A | | 6/1991 | Manico et al. | |
|---|---|---|---|---|---|
| 5,452,039 | A | * | 9/1995 | Michiels et al. | 396/568 |
| 5,678,290 | A | | 10/1997 | Good | 29/25.35 |
| 6,315,916 | B1 | | 11/2001 | Deutsch et al. | 216/83 |
| 6,413,700 | B1 | * | 7/2002 | Hallman et al. | 430/302 |
| 6,416,175 | B1 | | 7/2002 | Furukawa et al. | 347/103 |
| 6,461,061 | B1 | * | 10/2002 | Corbin et al. | 396/567 |
| 6,471,335 | B1 | * | 10/2002 | Gelbart | 347/49 |
| 6,502,913 | B1 | | 1/2003 | Ho et al. | 347/9 |
| 6,523,471 | B1 | | 2/2003 | Deutsch et al. | 216/83 |
| 6,533,387 | B1 | | 3/2003 | Simmons et al. | 347/32 |
| 6,688,784 | B1 | * | 2/2004 | Templeton | 396/611 |
| 6,691,618 | B1 | * | 2/2004 | Deutsch et al. | 101/465 |
| 6,720,131 | B1 | | 4/2004 | Fromson et al. | 430/302 |
| 6,747,684 | B1 | * | 6/2004 | Ornellas et al. | 347/243 |
| 6,793,418 | B1 | * | 9/2004 | Fromson et al. | 396/602 |
| 2002/0104455 | A1 | | 8/2002 | Deutsch et al. | 101/463.1 |
| 2003/0025756 | A1 | * | 2/2003 | Gonzalez | 347/33 |
| 2003/0072575 | A1 | | 4/2003 | Fromson et al. | |
| 2003/0137550 | A1 | | 7/2003 | Baiges | 347/20 |
| 2003/0193557 | A1 | | 10/2003 | Ornellas et al. | 347/243 |
| 2004/0241599 | A1 | * | 12/2004 | Fromson et al. | 430/434 |

FOREIGN PATENT DOCUMENTS

WO    WO 00/22482    4/2000

* cited by examiner

*Primary Examiner*—Daniel J. Colilla
(74) *Attorney, Agent, or Firm*—Alix, Yale & Ristas, LLP

(57) ABSTRACT

The invention relates to the development of lithographic printing plates and comprises the application of a thin film of developer solution to each plate in a controlled manner using a jetting printhead. Sensors and control means activate and deactivate the jetting printhead in response to the presence or absence of a plate. The developer is allowed to dwell on the plate as it is conveyed across a support structure for a sufficient time to allow for percolation into and/or dissolution of the soluble areas of the coating and is then washed off and sent to waste.

20 Claims, 4 Drawing Sheets

METHOD AND APPARATUS FOR APPLYING A FILM OF DEVELOPER FLUID ONTO A LITHOGRAPHIC PRINTING PLATE IN A DEVELOPING STATION

RELATED APPLICATIONS

This application is a continuation-in-part of U.S. application Ser. No. 10/446,582 filed May 28, 2003 now U.S. Pat. No. 6,720,131.

BACKGROUND OF THE INVENTION

The present invention is directed to a method and apparatus for applying a uniform film of fluid to a flat surface being conveyed through a workstation and specifically for applying a uniform film of developer to lithographic printing plates in a developing station. The invention is particularly directed to the use of a jetting printhead for uniformly distributing the fluid over the workpiece. The present invention is applicable to various planar workpieces and various types of workstations but is particularly applicable to lithographic printing plates which have been imaged and require the application of a developer to remove the areas of the coating on the plate which have been rendered soluble by the imaging process. Although the invention has a broader application, it will be described with particular reference to lithographic printing plate development.

One method for the development of the imaged plates entails the application of a thin film or layer of developing solution to the imaged plate surface of each imaged plate to be developed. This thin film of developer solution is allowed to dwell on the plate for a time sufficient to complete the development and then rinsed from the plate. Because only a thin film of developer solution is applied to each plate, any variation of any part of the surface of the plate from being substantially flat and horizontal and any variation in the thickness of the film of developer and any variation in the dwell time of the developer on different areas of the plate can result in the improper development of the coating. Also, the coating of individual, discrete plates requires the ability to precisely initiate the coating process and precisely terminate the coating process on individual plates delivered at irregular intervals. The developer fluid must be applied in the correct amount uniformly distributed across the width and length of the plate, with minimal waste.

Typical imaging methods include exposure to radiation and writing by ink jet. As is well known in the art, the imaging process renders the coating soluble in the imaged areas of a positive-working plate and renders the coating insoluble in the imaged areas of a negative-working plate. In either case, it is the coating which has been rendered soluble or the coating which has remained soluble that is removed. The particular compositions of the developer solutions for these different types of printing plates are well known. For example, many of the printing plates currently in use are positive-working plates and have coatings that contain alkali-soluble resins, specifically phenolic or acrylic resins. These coatings usually contain dissolution inhibitors that render them insoluble in the alkaline developers. The imaging process reverses this dissolution inhibition and the coating then becomes soluble in the areas subjected to the imaging radiation.

If the developer is applied to the surface in excess and the excess metered off by some device and subsequently recovered, the recovered excess has been exposed to the atmosphere, and as such is subject to degradation. It is well documented in the art that atmospheric carbon dioxide rapidly reduces the alkalinity of aqueous alkaline developers of the type very commonly used in the processing of positive-working plates. Thus the recovered developer that is being reused will not have the same alkalinity as fresh, new developer. This recovered developer is in fact therefore reused in a way that with each application of developer to the plate, some fraction of the developer metered off and recovered will have been removed in a previous cycle of development. Thus the repeated exposure to carbon dioxide and resultant degradation will further alter the effective alkalinity of the developer. Further, if the developer is applied some distance ahead of the point where the excess is removed, some degree of development is certain to take place and it may very well be uneven.

With positive-working plates, the difference between the solubility of the imaged and non-imaged areas of the coating is generally less than the difference in solubility for negative-working plates. For that reason, the development process is more critical for positive-working plates. Also, the development mechanism for positive-working plates is a percolation process and a quiescent film of developer solution is critical. Any relative movement between the developer and the surface of the plate must be minimized or eliminated. Furthermore, the film of developer must be uniform with no bubbles. For these reasons, it is critical how the developer is applied to the plate.

SUMMARY OF THE INVENTION

The invention is specifically directed to the development of lithographic printing plates and comprises a novel system and method for applying the thin film of developer solution to each plate in a controlled manner using a jetting printhead (commonly referred to as an inkjet printer) as a coating device operating in a continuous mode as the plate is conveyed through the developer station. The developer solution is allowed to dwell on the plate as it is conveyed across a horizontal support structure for a sufficient time to allow for percolation into and/or dissolution of the soluble areas of the coating. The invention permits and includes the processing of plates passing side-by-side through the developer and at different intervals.

DESCRIPTION OF THE PREFERRED EMBODIMENTS

Figure 1:
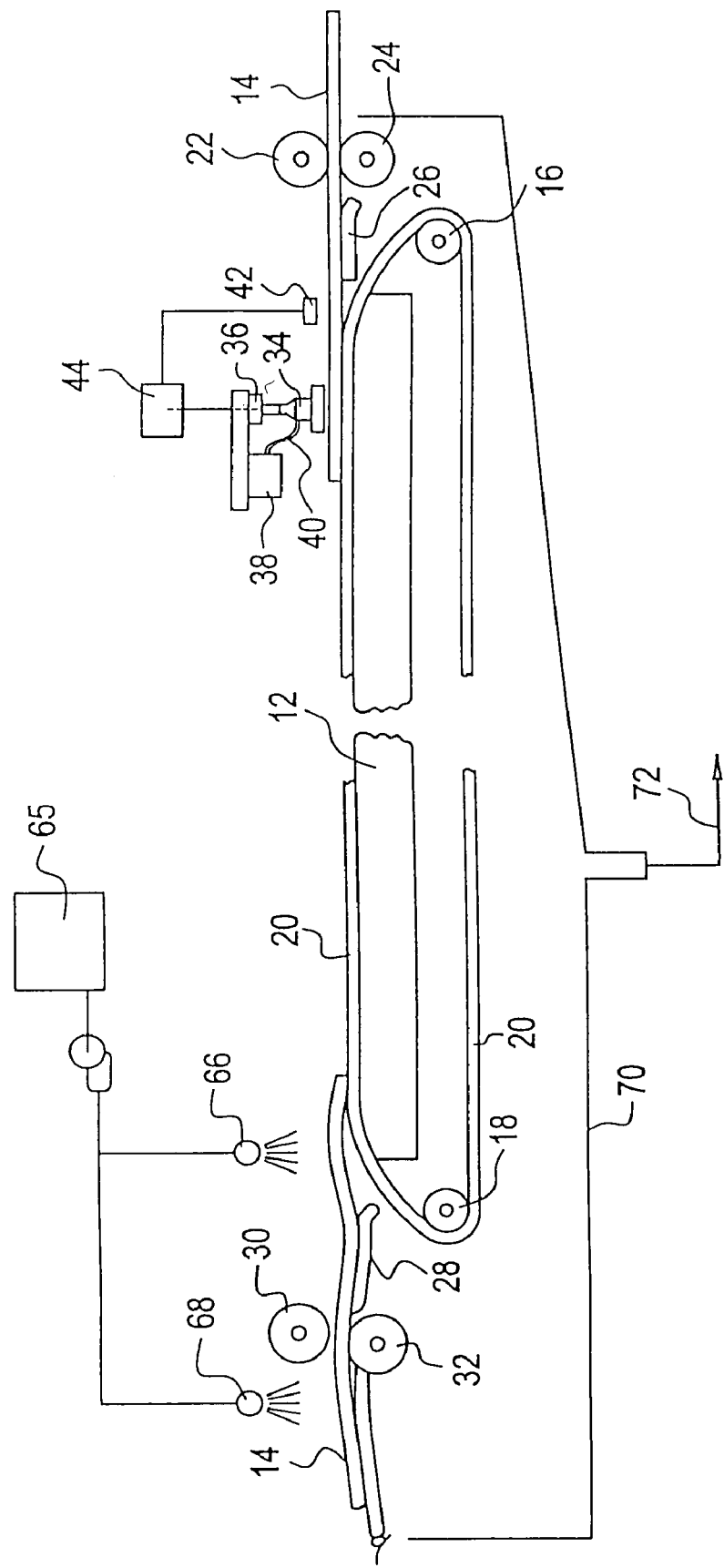
FIG. 1 is a general diagrammatic sketch of a first embodiment of a novel coating apparatus, specifically a lithographic printing plate developer, incorporating the novel method of the present invention for applying a uniform film of fluid to a moving flat surface.

FIG. 1 illustrates the general arrangement of one embodiment for practicing the invention illustrating the equipment and method for developing an imaged lithographic printing plate. The developer apparatus comprises a substantially horizontal support structure which is preferably a platen 12 which may be any flat, horizontal surface composed of materials which will be unaffected by the particular developer solution to be used. In the context of the present invention and as used herein, the terms substantially flat and or substantially horizontal are defined as deviating from flat and/or horizontal only to the degree that the developer solution applied to the plate does not flow over or off of the surface of the plate. That is, the developer solution will remain as a film on the plate and have a thickness that produces uniform development over the entire area of the plate. The printing plate 14, which has been exposed and thus imaged, is carried across the platen 12 by means of a conveyor which comprises the conveyor drive rollers 16 and 18 and a continuous flexible conveyor belt 20. The conveyor belt 20 is composed of a material which will be unaffected by the developer solution, such as stainless steel or a polymer material. The printing plate 14 is fed by the feed rollers 22 and 24 onto the feed platform 26 which directs the printing plate onto the conveyor belt 20 for transport across the platen 12. After processing, the printing plate is guided by the discharge platform 28 into a pair of discharge rollers 30 and 32. Although the flat platen is the preferred support structure, other supports can be employed for the conveyor belt. For example, the support structure could be a series of rollers which have a small diameter and are closely spaced such that they provide adequate support to maintain a flat plate. Also, although the drawing depicts a conveyor belt for conveying the plate across the support structure, other conveying means could be employed. Merely as one example, the plate can initially be conveyed across a support structure such as a platen by the feed rollers for the plate and it can then be further conveyed the remaining distance directly by small driven rollers.

In order to properly develop an imaged plate in accordance with the present invention, it is essential that the thin film of developer solution be substantially uniformly distributed over the entire upper, imaged surface of the plate as it is being conveyed across the platen. This requires that the plate on the conveyor be substantially flat and substantially horizontal or level and begins with having a substantially flat, horizontal support structure and, therefore, a substantially flat horizontal conveyor belt. Since the printing plates are very thin and flexible, surface tension is used to hold the plate firmly in position and flat on the conveyor belt. For example, this can be done by providing a film of water between the plate and the conveyor belt.

In the embodiment of FIG. 1., a jetting printhead represented at 34 is used for metering and feeding the developer solution to the plate to control the thickness and assure the uniformity of the developer solution on the plate. The jetting printhead 34 is mounted on the track 36 for movement back and forth across the plate in a raster or scan pattern as is well known in the inkjet printer technology. The developer solution in the jetting printhead 34 is replenished from the reservoir 38 through the flexible tube 40. The plate sensor 42, such as a photoelectric sensor, detects the leading and trailing ends of the plate 14. This sensor 42 is connected to the jetting printhead control unit 44 which is connected to and operates the jetting printhead. Since the conveyor speed is known, the plate sensor 42 can initiate operation of the jetting printhead at exactly the proper time to begin the coating right at the leading end of the plate. Likewise, the sensor can terminate operation when the trailing end has been coated.

In contrast to the known techniques where an excess of fluid is applied and subsequently metered off the plate, the present invention delivers precisely the required volume of developer at precisely the rate required to obtain a uniform film of developer on the plate in the amount needed to process the plate with very little excess. The delivery of the developer is commenced at the beginning of the plate and continues at the appropriate rate until the end of the plate where it is stopped. Since there is little if any excess developer applied, the problems with developer degradation that arise from the recirculation of excess developer are eliminated.

The printing plate which has been coated with the developer solution continues to travel across the platen. The length and speed of travel is selected such that the developer solution will have completed the development process by the time the printing plate reaches the discharge end of the platen. A typical development time is 20 to 60 seconds. At this point, rinse water from the supply 65 is sprayed onto the plate through the spray nozzles 66 and 68. Located below the conveyor structure is a collection pan 70 which collects all of the liquid run off from the printing plate including the spent developer solution and rinse water now containing the portion of the coating which has been dissolved away. The developer solution which is rinsed from the plate is collected at 72 and sent to waste. It can be seen that there is always only fresh developer solution being applied to the plates and that there is only a small quantity of developer solution applied to each plate. It has been discovered that the consumption of developer solution can be reduced by as much as 50% when compared to a conventional printing plate development processor.

Figure 2:
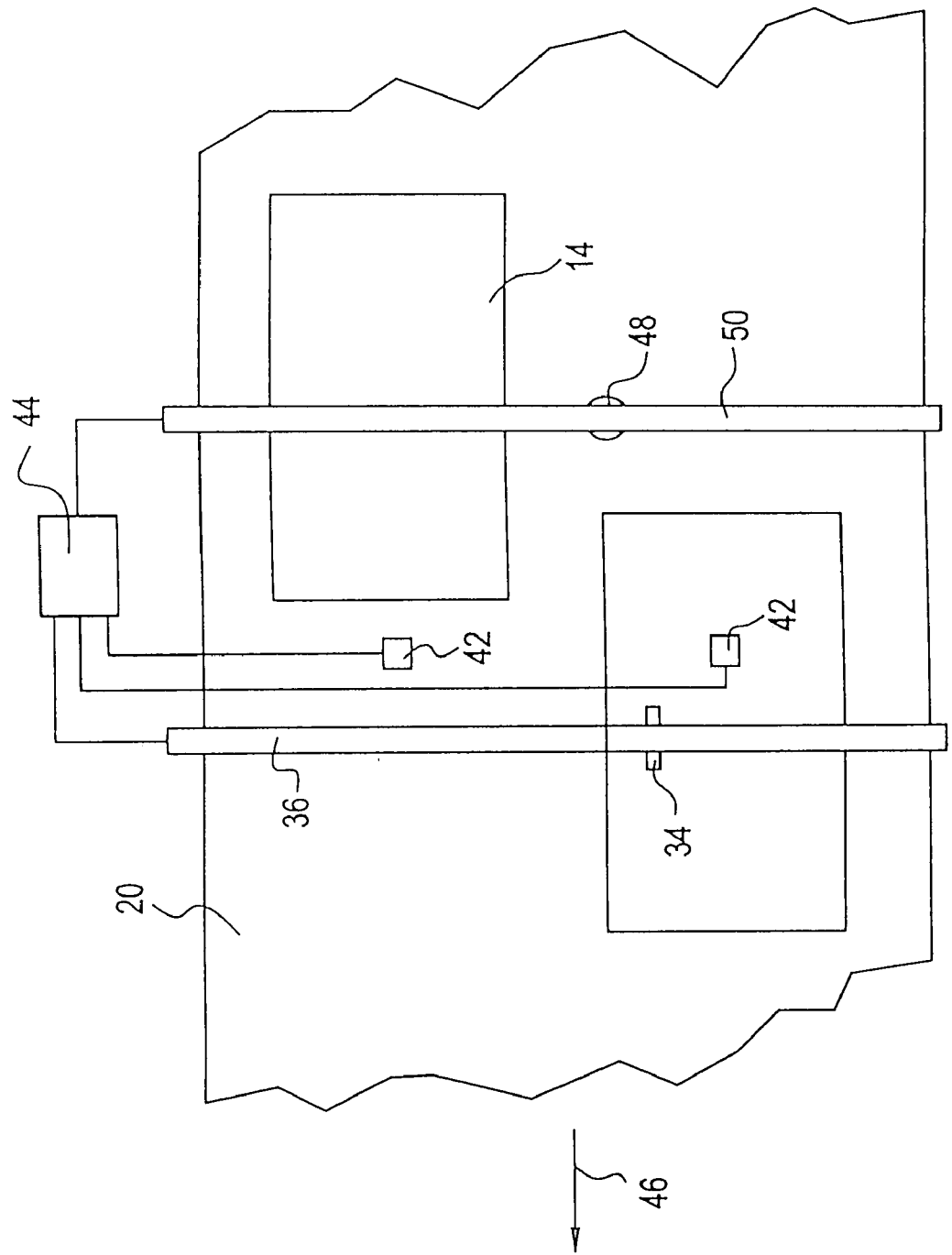
FIG. 2 is a diagrammatic plan view of the conveyor of FIG. 1 showing the processing of two plate lines at different intervals.

The present invention is also particularly suited to the development of lithographic printing plates in a plurality of lines or lanes in a single developing station with a single conveyor system. This aspect of the system is shown in FIG. 2 which illustrates a portion of the conveyor belt 20 moving in the direction of the arrow 46. Located on the conveyor belt 20 are two plates 14 (it could be more than two) in side-by-side relationship. The two plates can be directly side-by-side or they can be staggered as may be desired or convenient as shown in this FIG. 2. In effect, each plate has its own "lane" on the conveyor belt. Extending across the conveyor belt is the track 36 on which is mounted the jetting printhead 34 for movement back and forth across both plates. A plate sensor 42 is located in each lane for detecting the leading and trailing ends of the plates. These sensors are connected to the control unit 44 whereby the jetting printhead can be activated to move and activated to dispense the developer solution only in a lane containing a plate. In other words, the jetting printhead will dispense developer during the travel across a plate in one lane but will then shut off during the travel across the empty lane. As a further refinement, an optical scanner 48 mounted on a track 50 may be used to detect the side edges of the plates. With this scanner 48 connected to the control unit 44, the jetting printhead can be activated to dispense the developer only onto the plates. The dispensing of developer would then be deactivated between plates and past the outside edges of the plates.

A specific example of jetting printhead which could be employed in the present invention is the Spectra Nova 256/80 series of printhead from Spectra, Inc. of Lebanon, N.H. These printheads have the following characteristics:

| | |
|---|---|
| Image height | 2.8 inches |
| Number of orifices | 256 |
| Drop rate per orifice | 20,000/sec. |
| Drop volume | 75 picoliters (pl) |

To process plates at the rate of 48 inches per minute, the time for each swipe of the printhead would be:

$$\frac{2.8 \text{ inches} \times 60 \text{ sec./min.}}{48 \text{ inches/min.}} = 3.5 \text{ seconds}$$

Thus there would be:

3.5 sec.×20,000 drops/sec.–70,000 drops/orifice/ swipe

For 256 orifices, there would be:

256×70,000 drops×75 pl=1.34 ml=0.082 in³

For a 14 inch wide plate, the area covered in one swipe is 39.2 in². Therefore, the film thickness is:

$$\frac{0.082 \text{ in}^3}{39.2 \text{ in}^2} = 0.0021 \text{ in or } 2.1 \text{ mils}$$

A feature of the invention is that the fluid is applied uniformly over the plate at the required thickness. This contrasts sharply with prior art arrangements where the fluid is applied to the plate some distance ahead of a device which spreads the developer uniformly over the plate. A further feature is that the fluid is applied in the exact amount required to form a uniform film of the desired thickness without the need to remove and recycle excess fluid.

Figure 3:
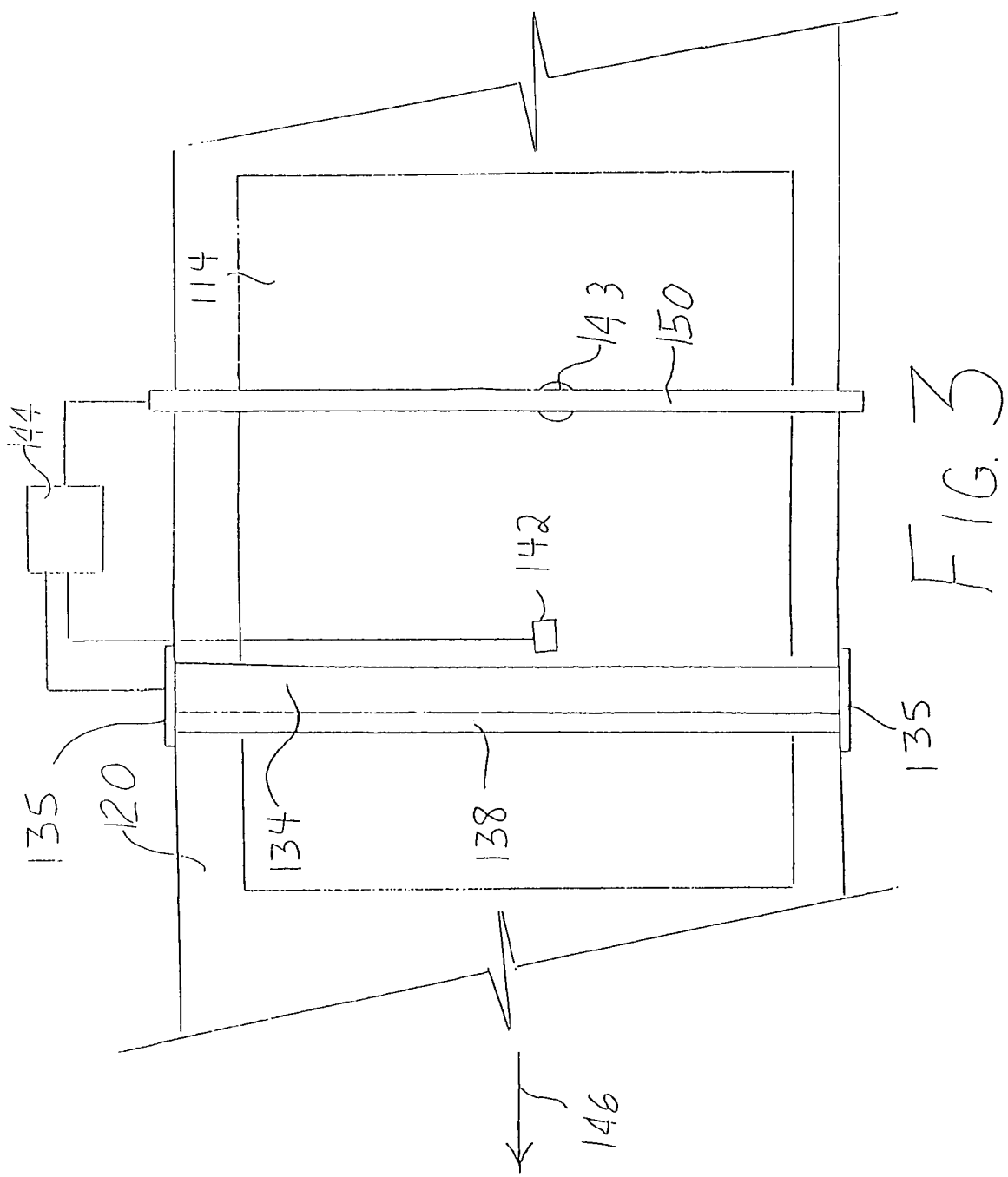
FIG. 3 is a schematic plan view of a second embodiment of a coating apparatus incorporating the invention.

FIG. 3 schematically shows another embodiment of the invention, in which a wide jetting printhead 134 is used for metering and feeding the developer solution to the plate to control the thickness and assure the uniformity of the developer solution on the plate. In this embodiment, the jetting printhead 134 is fixed to a stationary support frame 135 on each side of the conveyor belt 120. The conveyor belt 120 is configured to move in the direction of arrow 146. The developer solution in the jetting printhead 134 is replenished from a reservoir 138 which can be formed on or mounted to the printhead 134, or can be a separate component. The printhead 134 has a length generally corresponding to the width of the conveyor 120. As an alternative, two, three, four or more printheads can be arranged side-by-side to extend across the width of the conveyor. The printhead 134 has jetting nozzles along substantially its entire length. The control means 144 provide for the ejection of developer through selected nozzles in response to input from sensors 142, 143 which detect the presence of, and the dimensions of, one or more plates 114. The use of a wide printhead 134 provides for rapid and precise jetting of developer onto the plate 114.

The first sensor 142, such as an optical sensor, detects the leading and trailing ends of the plate 114. The second sensor 143, which preferably is a scanning optical sensor mounted on a track 150, detects the sides of the one or more plates 114. The first and second sensors 142, 143 are connected to the jetting printhead control unit 144, which is connected to and operates the jetting printhead 134. Because the conveyor speed is known, the first sensor 142 can initiate operation of the jetting printhead 134 at exactly the proper time to begin the coating right at the leading end of the plate. Similarly, the first sensor 142 can terminate operation when the trailing end has been coated. With regard to the second sensor 143 it sends signals to the control unit 144 indicating which nozzles of the jetting printhead 134 are to be turned on and off. The sensor 143 prevents the jetting of developer onto the conveyer 120 between multiple plates 114 and along the sides of the conveyor 120.

In a less preferred embodiment (not shown) using a wide printhead, the continuous conveyor is replaced by a plate delivery apparatus that temporarily positions a plate in a stationary position beneath a wide jetting printhead which is configured to move along the length of the plate in a direction parallel to the direction of travel of the plate delivery apparatus in order to jet a uniform coating of developer over the plate. In this case, the wide jetting printhead moves relative to the plate in order to rapidly apply the developer to the entire plate.

Figure 4:
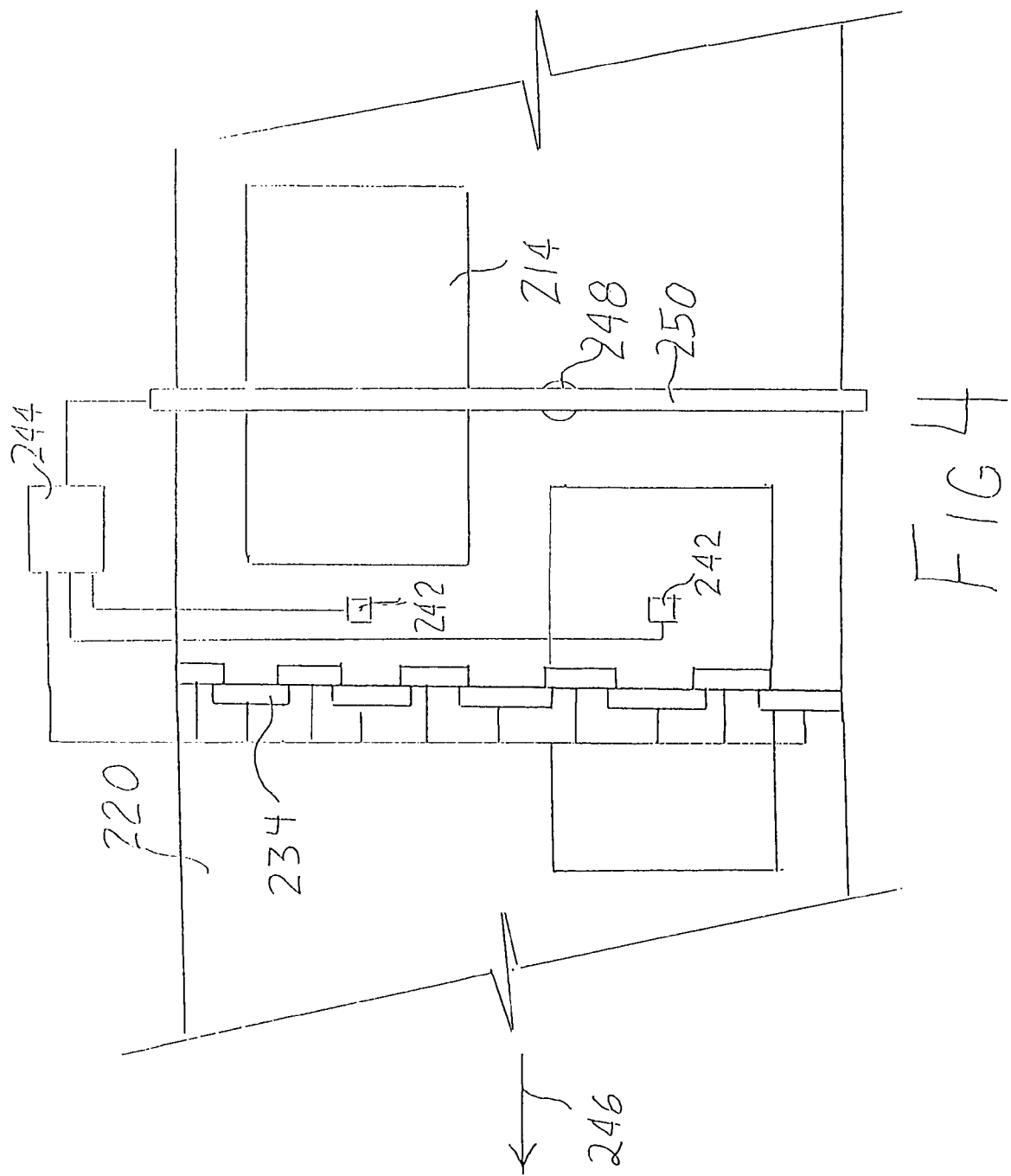
FIG. 4 is a schematic plan view of a third embodiment of a coating apparatus according to the invention.

FIG. 4 schematically shows an embodiment in which a plurality of small printheads 234 are aligned in a staggered arrangement across the width of a conveyor 220 in order to quickly apply a uniform coating of developer to plates 214 which are moved by the conveyor 220 in the direction of arrow 246. The leading and trailing edges of the plates 214 are detected with sensors 242 and the sides of the plates are detected with one or more sensors 248 mounted on a support beam or track 250. A controller 244 selectively activates the printheads 234 in order to evenly coat the plates 214 with developer while minimizing overspray onto the conveyor 220. This embodiment may provide economic advantages in that a number of small, low-cost printheads 234 can be aligned to achieve a uniform spray over the plate in a time-efficient manner. The advantage of staggering the printheads 234 is to ensure that each portion of the plate can be contacted by a jetting printhead in the event that the individual printheads 234 do not have jets positioned along their outer edges. The printheads 234 may be of uniform or varying sizes.

The invention claimed is:

1. Apparatus for developing imaged lithographic printing plates having soluble areas of coating comprising conveying means for moving said plates across a substantially horizontal support structure, means for applying developer solution to said imaged plates whereby said soluble areas of coating are dissolved in said developer solution to produce spent developer solution and developed plates, and means for removing said spent developer solution from said developed plates wherein said means for applying developer solution comprises:
   a. printhead means for jetting said developer solution onto said plates;
   b. means for feeding said developer solution to said printhead means;
   c. mounting means for mounting said printhead means above said conveying means; and
   d. control means for activating said printhead means to jet developer solution in response to the presence of a plate under said printhead means and for deactivating said printhead means in response to the absence of a plate under said printhead means.

2. Apparatus as recited in claim 1, wherein said printhead means is stationary.

3. Apparatus as recited in claim 2 wherein the length of said printhead means is equivalent to or greater than the width of said plates.

4. Apparatus as recited in claim 2, wherein said printhead means comprises a plurality of discrete printheads in a linear arrangement.

5. Apparatus as recited in claim 2, wherein said printhead means comprises a plurality of discrete printheads in a staggered arrangement.

6. Apparatus as recited in claim 3, wherein said printhead means has plurality of jet nozzles along its length.

7. Apparatus as recited in claim 6, wherein said jet nozzles can be selectively activated.

8. Apparatus as recited in claim 6, wherein said control means includes means for selectively activating said jet nozzles.

9. Apparatus as recited in claim 1 wherein said control means
includes an end sensor adapted to sense the leading and trailing ends of said plates.

10. Apparatus as recited in claim 9 wherein said end sensor is an optical sensor.

11. Apparatus as recited in claim 9 wherein said control means further includes side sensing means adapted to sense the sides of said plates.

12. Apparatus as recited in claim 11 wherein said side sensing means comprises a scanning optical sensor.

13. Apparatus as recited in claim 1 further including a reservoir for feeding developer solution to said printhead means.

14. Apparatus for developing imaged lithographic printing plates having soluble areas of coating comprising conveying means for moving said plates across a substantially horizontal support structure and means for applying developer solution onto said plates whereby said soluble areas of coating are dissolved wherein said means for applying developer solution comprises:
 a. printhead means for jetting said developer solution onto said plates;
 b. means for feeding said developer solution to said printhead means;
 c. mounting means for mounting said printhead means above said conveying means; and
 d. control means for activating said printhead means to jet developer solution in response to the presence of a plate under said printhead means and for deactivating said printhead means in response to the absence of a plate under said printhead means.

15. Apparatus as recited in claim 14 and further including means for removing said dissolved soluble areas of coating from said plates.

16. Apparatus as recited in claim 15 wherein said means for removing said dissolved soluble areas of coating comprises means for applying rinse water to said plates.

17. A method of applying a thin film of developer solution to lithographic printing plates having imaged coatings on a surface thereof comprising areas of coating insoluble in said developer solution and areas of coating soluble in said developer solution, said method comprising conveying said plates across a substantially horizontal support structure and jetting a uniform layer of developer solution onto said imaged coatings with a jetting printhead to dissolve said soluble coating and produce a spent developer solution and developed plates and removing said spent developer solution from said developed plates and discharging said spent developer solution to waste.

18. A method as recited in claim 17 further comprising the steps of sensing the leading ends of said plates being conveyed to activate said jetting of said jetting printhead and sensing the trailing ends of said plates being conveyed to deactivate said jetting of said jetting printhead.

19. A method as recited in claim 18 and further comprising the step of sensing the sides of said plates being conveyed and thereby activating and deactivating said jetting of said jetting printhead.

20. A method as recited in claim 17 wherein said step jetting printhead is stationary.

* * * * *

UNITED STATES PATENT AND TRADEMARK OFFICE
CERTIFICATE OF CORRECTION

| | |
|---|---|
| PATENT NO. | : 7,013,806 B2 |
| APPLICATION NO. | : 10/783759 |
| DATED | : March 21, 2006 |
| INVENTOR(S) | : Fromson et al. |

Page 1 of 1

It is certified that error appears in the above-identified patent and that said Letters Patent is hereby corrected as shown below:

<u>Column 8</u>:

Line 33, after "said" delete "step".

Signed and Sealed this

Twenty-sixth Day of December, 2006

JON W. DUDAS
*Director of the United States Patent and Trademark Office*